(12) United States Patent
Okamoto et al.

(10) Patent No.: US 7,078,343 B2
(45) Date of Patent: Jul. 18, 2006

(54) METHOD OF MANUFACTURING COMPOUND SEMICONDUCTOR WAFER

(75) Inventors: Takatoshi Okamoto, Itami (JP); Yoshio Mezaki, Itami (JP); Toshiyuki Morimoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 231 days.

(21) Appl. No.: 10/258,414

(22) PCT Filed: Mar. 1, 2002

(86) PCT No.: PCT/JP02/01936

§ 371 (c)(1),
(2), (4) Date: Oct. 19, 2002

(87) PCT Pub. No.: WO02/071461

PCT Pub. Date: Sep. 12, 2002

(65) Prior Publication Data
US 2003/0104696 A1    Jun. 5, 2003

(30) Foreign Application Priority Data
Mar. 6, 2001  (JP) .............................. 2001-061178

(51) Int. Cl.
  *H01L 21/302*  (2006.01)
  *H01L 21/461*  (2006.01)
(52) U.S. Cl. ..................... 438/690; 438/691; 438/692
(58) Field of Classification Search ......... 438/690–693
See application file for complete search history.

(56) References Cited

U.S. PATENT DOCUMENTS

| 6,069,083 A * | 5/2000 | Miyashita et al. .......... 438/693 |
| 6,338,805 B1 * | 1/2002 | Anderson .................... 216/89 |
| 2003/0036570 A1* | 2/2003 | Abe ........................... 516/113 |
| 2003/0139067 A1* | 7/2003 | Abe et al. .................. 438/800 |

FOREIGN PATENT DOCUMENTS

| EP | 926714 A1 | 6/1999 |
| JP | 4-213825 A | 8/1992 |
| JP | 5-166785 A | 7/1993 |
| JP | 6-151304 A | 5/1994 |
| JP | 11-204471 A | 7/1999 |
| JP | 2000-308961 A | 11/2000 |

* cited by examiner

Primary Examiner—Duy-Vu N. Deo
(74) Attorney, Agent, or Firm—James W. Judge (57) ABSTRACT

Compound-semiconductor-wafer manufacturing whereby particle adherence, and obverse-surface oxidization and alteration are slight and the use of organic solvents is reduced. An adsorption pad is bonded to a polishing plate, and a wafer being adsorbed onto the adsorption pad without using wax is polished and thereafter stored within purified water without drying. Since storage is within purified water, particle adherence, and obverse-surface oxidization and alteration turn out to be slight, yielding a high-quality wafer. In the cleaning procedure following the aquatic storage, organic solvent washing is omitted. This allows the use/ waste volume of noxious organic solvent to be reduced.

9 Claims, 7 Drawing Sheets

FIG.1(a)  Polishing-Prepocess Procedure

FIG.1(b)  Polishing Procedure

FIG.1(c)  Cleaning Procedure

FIG.1(d)  Inspection/Measuring Procedure

FIG.1(e)  Final Cleaning Procedure

Oxidization Film Comparison

FIG. 7

Prior art

FIG. 8

New technique

METHOD OF MANUFACTURING COMPOUND SEMICONDUCTOR WAFER

TECHNICAL FIELD

The present invention relates to methods of manufacturing compound semiconductor wafers. It relates in particular to a method for polishing sliced wafers to a mirrorlike finish, and to a novel method for post-polishing wafer storage. A "compound semiconductor" means a semiconductor that is of a compound such as gallium arsenide (GaAs), indium phosphate (InP), or gallium phosphate (GaP). From polycrystalline raw materials, single crystals are grown by a crystal-growth technique such as the vertical boat (VB) method, liquid-encapsulated Czochralski (LEC) method, or horizontal Bridgman (HB) method. A single-crystal ingot is sliced into thin slices to produce "as-cut" wafers. These are processed through procedures such as pre-processing, polishing, cleaning, inspection/measuring, and final cleaning procedures, and shipped as "mirror wafers" to the device manufacturer.

BACKGROUND ART

A compound semiconductor wafer manufacturing method is as follows. A cylindrical single-crystal ingot is grown from a polycrystalline raw material using single-crystal-growing equipment such as an LEC device, an HB device, or a VB device. Single-crystal ingots that do not turn out cylindrical are ground into a cylinder. The cylindrical single-crystal ingot is sliced through a plane perpendicular to its axis, rendering an as-cut wafer of constant thickness. The ridgeline along the wafer circumferentially is then thinly shaved obliquely. This is called chamfering or beveling. This wafer is treated by etching—lapping—etching processes. The etching process at the beginning removes manufacturing distortions; the lapping process makes the thickness a predetermined depth; the etching process at the end removes distortions due to lapping. The initial etching process can be left out. A beveled wafer of constant thickness is thus produced. These steps will herein be referred to as a polishing preprocess procedure.

Subsequently, to make an as-cut wafer into a mirror wafer, a number of processes are carried out. Process flow according to a conventional method will be explained using FIG. 1 (left side) and FIG. 2. Herein several processes will be collectively termed a procedure. A single procedure is a set of a plurality of processes. How they are arranged is not fixed; herein they are classified according the inventors' preference. Likewise, the process categories themselves differ depending on the objective and on the persons involved.

Explanations are more often made without segregating processes from procedures. Moreover, while "process" is often used as a concept that is broader than "procedure," such will not be the case in this specification. As set out by the present invention, process as a minor category will for convenience of explanation be distinguished from procedure as a major category.

The procedures herein are a group of five as in FIG. 1: a polishing-preprocess procedure (a); a polishing procedure (b); a cleaning procedure (c); an inspection/measuring procedure (d); and a final cleaning procedure (e). A single procedure includes a plurality of processes. To the end of the word "process," "operation," "step," or nothing at all, will be affixed. Procedure and process should not be confused.

(a) Polishing-Preprocess Procedure (Preparatory Procedure for Polishing)

A. Lapping—flattens either surface of as-cut wafers to a predetermined thickness. Etching to remove slicing-procedure distortions is sometimes done prior to that. Herein the etching process at the beginning is omitted. The wafers are then beveled to shave the ridgeline diagonally smooth.

B. Etching—removes processing distortions due to lapping.

(b) Polishing Procedure (Procedure for Polishing Wafers Using Polishing Equipment)

C. Applying paste to non-polish surface—the reverse surfaces of the wafers are heated and a flowing wax (the paste) is spread on them to paste them to a polishing plate. This is because without the wax the wafers will not adhere to the polishing plate. Applying the wax smudges the wafers, and the smudges cannot easily be removed. This is a problem.

D. Pasting to polishing plate—the reverse surfaces of the wafers, smeared with the wax, are pasted to the polishing plate. Four wafers are pasted to a single polishing plate in FIG. 2. The exteriorly exposed surface is the obverse surface. The polishing plate is a jig that is a disk onto which a shaft is fixed. Some is for single-wafer, and some is for multiple-wafer, depending on the dimensions. When the temperature lowers, the wax hardens, and the wafer is held fast to the polishing plate.

E. Mirror Polishing—the polishing face of the polishing plate is set onto a broad platen onto which a polishing cloth is bonded, and the wafers are pressed against the platen by putting pressure on the shaft. The platen is rotated while a polishing liquid is fed in. Herein, a single polishing plate on a single platen is illustrated, but a plurality of polishing plates can be set onto the polishing cloth and polished simultaneously. The obverse surface is thereby mirror-polished smooth and flat.

F. Drying—the polished wafers, attached as they are to the polishing plate, undergo as in FIG. 2 a simple wash using purified water. Thereafter they are dried while still attached to the polishing plate. Drying is done in the atmosphere (clean-room), and this operation actually gives rise to many problems. Because there is oxygen within the atmosphere, the obverse surface oxidizes. Due to the ambient atmosphere, the obverse surface alters. More than anything else, debris (particles) within the air fall in due course and adhere to the wafers. Fouling matter on the obverse surface of a damp-dried wafer is not easily removed. In short, on account of the post-polish drying, deterioration of the obverse surface in that particles adhere to it, and it alters and oxidizes, is brought about.

G. Peeling off from the polishing plate—the wafers are firmly fixed to the polishing plate by the wax. The polishing plate is heated to make the wax run, and the wafers are unstuck from the polishing plate using a spatula. While the obverse surface has become fine and mirror-like, the reverse surface is left smeared with wax.

Figure 1A:
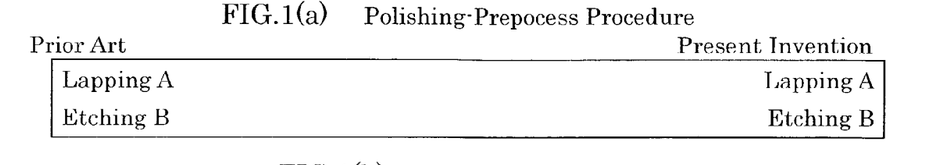
FIG. 1 is a diagram showing at a glance a series of processes in a conventional method for manufacturing compound semiconductor wafers, contrasted with a series of processes in a method for manufacturing compound semiconductor wafers under the present invention.
Figure 1B:
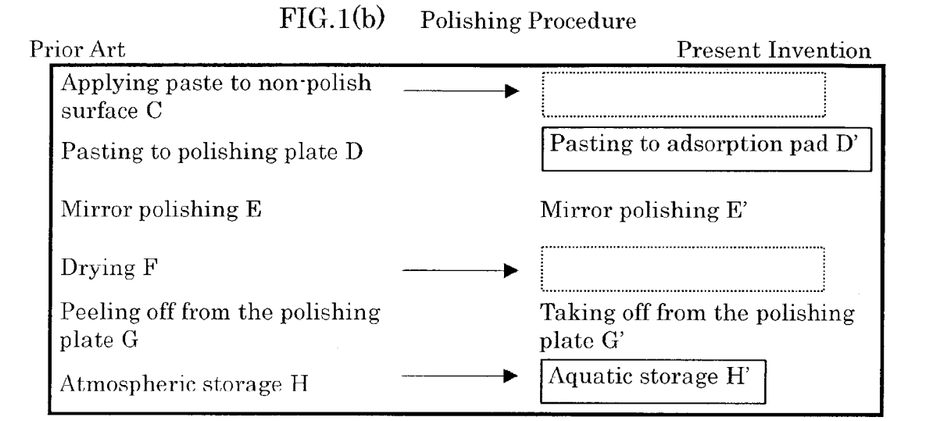
Figure 1C:
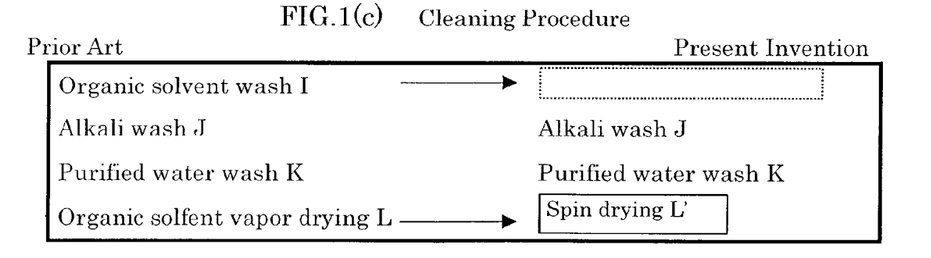
Figure 1D:
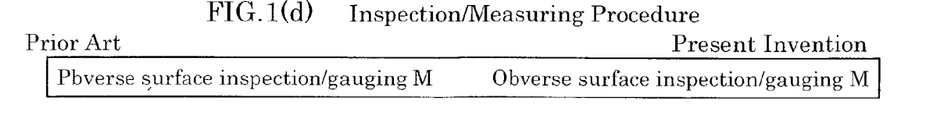
Figure 1E:
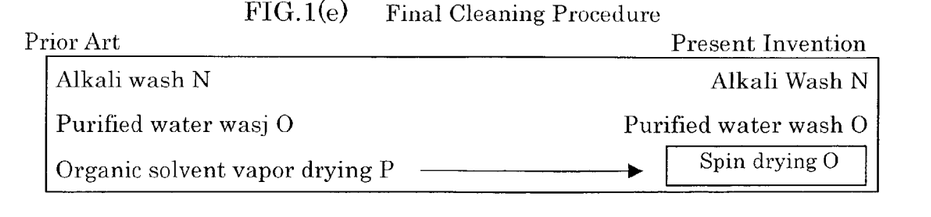
Figure 2:
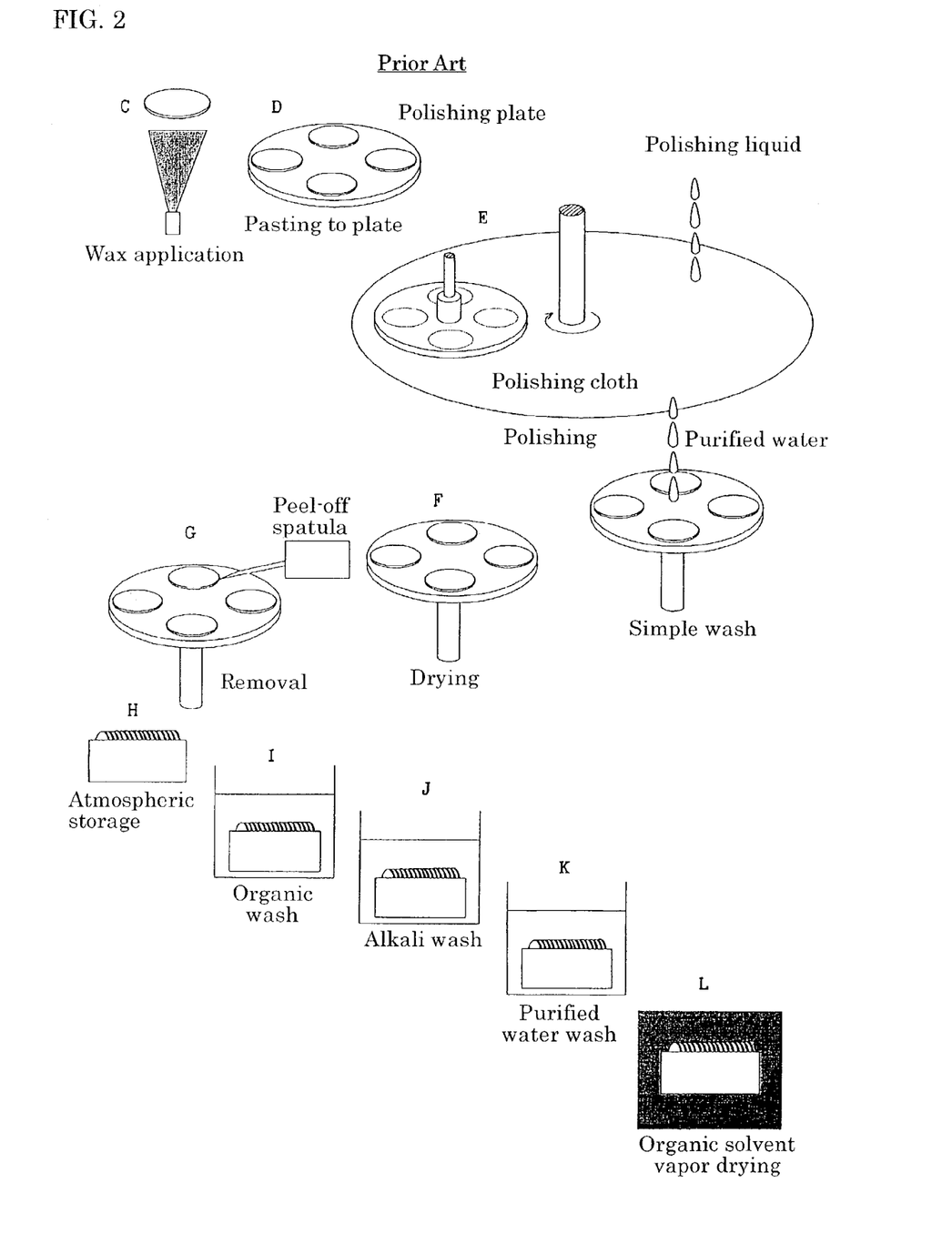
FIG. 2 is a perspective view illustrating the process series in the conventional method for manufacturing compound semiconductor wafers.

H. Atmospheric storage—as indicated in FIG. 2, a plurality of wafers is housed into a cassette, which is stored atmospherically.

The foregoing C.—H. are the polishing procedure. What is thereby obtained is wafers whose obverse surface is polished mirror-like, and on whose reverse surface wax (organic compound) is adhered.

(c) Cleaning Procedure (Using Organic Solvent, Alkali, and Purified Water to Wash Away Wax Smeared on Wafer Reverse Surface, and Particles Adhered to the Obverse Surface)

I. Organic solvent wash—the wafers are washed in an organic solvent such as acetone or alcohol. Clears away wax on the reverse surface. Also gets rid of smudges adhering to the obverse surface. Since the wafers are adhered with wax, this process is indispensable.

J. Alkali wash—organic solvent, obverse-surface oxidization film, and smudges are taken away using caustic soda or the like.

K. Purified water wash—organic solvent, alkali, and smudges are taken away using purified water.

L. Organic solvent vapor drying—the purified water or other cleaning liquid is globally subjected to rapid vaporization and the wafer is dried.

Processes I.—L. are the cleaning procedure. This procedure may be carried out step-by-step with the plurality of wafers put into a cassette. Through this procedure the wafers turn out as mirror wafers having a clean obverse surface.

(d) Inspection/Measuring Procedure (Inspection/Measuring According to Specifications from the Shipping Destination)

M. Obverse surface inspection/gauging—microscopic observation of the wafer obverse surface and gauging of particle density are performed. For example, the number of particles whose diameter is a set value or more is counted. Mirror wafers that meet the specifications of the shipping destination (device manufacturer) will thereby be produced. Wafers passing these tests undergo a final cleaning as needed and are shipped out.

(e) Final Cleaning Procedure (Final Manufacturer-End Cleaning of Wafers that have Passed Inspection)

N. Alkali wash—organic solvent, organic matter and other contaminants adhering to the obverse surface are taken away using alkali.

O. Purified water wash—organic solvent, alkali, and smudges are taken away using purified water.

P. Organic solvent vapor drying—the purified water or other cleaning liquid is globally subjected to rapid vaporization and the wafer is dried.

In this way mirror wafers are fabricated, and are shipped in that state to the device maker. As such the device maker cannot use them as substrates for thin-film growing (layering). This is because in the course after being packaged and until reaching the device maker they become oxidized, contaminated, and dirtied with adhering particles. Therefore, prior to thin-film growing the wafers have had to be etched and cleaned on the manufacturer's end.

Prior Art I., Japanese Pub. Pat. App. No. H11-204471, "Compound Semiconductor Wafer Manufacturing Method," provides for oxidizing using ozone after polishing a semiconductor wafer and before drying and cleaning. An oxide layer that is 1.5 nm or more in thickness is said to be satisfactory. Fashioning the oxide layer leads to debris riding onto the oxide layer on the wafer. Subsequently cleaning using alkali to get rid of the oxide layer and at once to get rid of the debris is then provided for. This means that the obverse surface will become clean, since removing the oxide layer also removes the debris thereon.

Nevertheless, in this situation in which a thick oxide layer is thus cleared away with alkali, roughness appears in the obverse surface of the wafer, such that it is no longer a mirror wafer. Furthermore, it can happen that a wafer is oxidized after being soiled with debris, such that the wafer will not be oxidized beneath where the debris is. Since the unoxidized areas will not be taken away by the alkali wash, the debris will remain as it is in form. Though a compound semiconductor wafer is oxidized naturally in the atmosphere, a thinner oxide layer is better. Deliberately oxidizing, a concept that might crop up interestingly enough, would not attain the anticipated objectives.

The procedures for manufacturing a clean, mirrorlike wafer are completed according to the polishing-preprocess procedure (a) through the final cleaning procedure (e). There are problems as follows with the procedures described above.

1. Particles adhere to the wafer obverse surface in the drying process F. that follows polishing. Foreign matter cannot easily be taken off a wafer when it is wetted with water. Repeatedly cleaning any number of times reduces the number of particles to a certain extent. But the adhering particles cannot be gotten rid of entirely.

2. In the post-polishing drying process F. the wafer obverse surface alters because it is exposed to the atmosphere.

3. Since the wafers are attached to the polishing plate with wax, organic matter remains behind. Residual organic matter on the substrate obverse surface gives rise to negative influences when thin films are built on it later.

4. In order to get rid of the wax, the wafers are cleaned using an organic solvent. Completely taking off the wax using an organic solvent is difficult, however. Even if the cleaning liquid is increased, and even with multi-stage cleaning, the organic matter cannot be gotten rid of completely.

5. Excessive use of organic solvents worsens the work environment. Disposing of the liquid waste from the organic solvent also becomes a problem.

6. Organic and foreign matter remaining behind on the wafer obverse surface have led to abnormal growth when the thin films are grown at the device maker.

7. In order to prevent abnormal growth, etching and cleaning have to be carried out on the device maker end (at the shipping destination).

DISCLOSURE OF INVENTION

One object of the present invention is to resolve drawbacks as in the foregoing, by providing a wafer manufacturing method through which there is no possibility of the wafers being contaminated by organic matter, such as wax, used for joining. Another object of the present invention is to provide a wafer manufacturing method in which the use of organic solvent is reduced to contribute significantly to environmental protection. Yet another object of the present invention is to provide a wafer manufacturing method rendered so as not to give rise to quality-deteriorating factors—such as adherence of debris, oxidization, or alteration—due to post-polish drying of the wafers in the atmosphere. A further object of the present invention is to provide a wafer manufacturing method that enables the fabrication of wafers having an advanced degree of cleanness without requiring re-cleaning at the shipping destination (device maker).

Features of a method under the present invention of manufacturing a compound semiconductor wafer are that the wafers are, without using an organic joining material, adsorbed onto an adsorption pad and mirror-polished, and the post-mirror-polished wafers are stored in water within an ultra-purified water vat. The wafers that have been stored within water are, with no cleaning in organic solvent, alkali washed, purified-water washed, and dried to produce clean, mirror-polished wafers.

Specifically, the wafers are adsorbed onto an adsorption pad without in the least using wax or any other organic joining material. This is one feature. One other is that the storing into water is without post-polish drying—which is not atmospheric storage, but aquatic storage. There are thus two features, each with superior effects.

Since the reverse surface of the wafers is not pasted with wax, it is not smudged by wax. Cleaning with an organic solvent is therefore unnecessary. This is effective in getting the wafer obverse surface to be uncontaminated. Once wax has been smeared on, the organic matter/components won't come off easily, even cleaning with an organic solvent. Since with the present invention, organic matter is from the start not applied, it is not necessary to clean with an organic solvent, and the wafers are made sufficiently clean with alkali and purified water washes.

In addition to that, aquatic storage is epochal. As noted earlier post-polish drying is detrimental in that it leads to adherence of foreign matter, and to alteration of the wafer obverse surface. With the present invention, since the wafers without being dried are aquatically stored in a purified water vat, the problem of the wafers getting smudged while drying disappears. Problems with the wafer surface oxidizing/ altering while drying, or else with foreign matter firmly clinging to the wafers may be solved. The storage method is truly unconventional and surpassing.

In removing the wafers from the polishing plate, the difficulties of heating and scraping them off are unnecessary; the wafers come off by cooling with a water jet, or otherwise come off as they are with a spatula. Employing an adsorption pad is one requirement of the present invention.

Adsorption pads themselves are publicly known, and have been developed for non-wax wafer polishing. They are sometimes also referred to as "packing pads" or "templates." They are thin porous sheets of plastic and are adhered to a metal jig such as a polishing plate with, e.g., adhesive tape. They are pliant materials with flatness nonetheless. To attach wafers to the pads, organic joining material such as wax is not needed.

Though there is any number of kinds, certain pads are such that the wafer is wet with water and pressed onto the pad. After polishing the wafer may be detached with a spatula. Alternatively, the pad is heated and the wafer is pressed on. After polishing it is cooled and the wafer is removed with a spatula. Because it is suitably pliant, the adsorption pad retains the wafer gently. The holding power against slipping is, however, not strong in the way that wax is. Therefore, a shallow wafer-mounting hole whose diameter is about equal to the size of the wafer is formed in the polishing plate, and the adsorption pad is fixed into the wafer-mounting hole. Supposing that the adsorption pad thickness is d, the hole depth is t, and the wafer thickness is w, then $d<t<d+w$. The mounting hole retains that much $(d+w-t)$ of the wafer circumferential surface that is in excess of the hole depth. Accordingly, when the polishing plate is pressed onto the polishing platen and the platen is rotated, the wafers on the polishing plate become polished.

The adsorption pad has been described. The present invention uses an adsorption pad for non-wax polishing of wafers. Non-wax polishing, though a new technology, is previously known publicly; and the adsorption pad itself is not novel. However, polishing that uses a conventional adsorption pad to date has been the post-polish drying and atmospheric storage in FIG. 1. It has therefore not been possible to overcome the drawbacks of debris adhering to the wafers, the surface oxidizing, and the surface altering. Debris stuck on a water-wet wafer agglutinates after drying and is hard to get off. When devices are built on the surface, alteration therein produces inconsistencies in the characteristics. While surface oxidization is said to be gotten rid of by alkali treatment, even though the oxidization film may be removed with alkali, since it is thick and not uniform, jaggedness appears.

The present invention is non-wax wafer polishing using adsorption pads, and storage of the wafers in water, and so is strikingly capable of ingeniously preventing wafer contamination, oxidization and alteration. Inasmuch as the wafers are stored in water, particles do not adhere, the surface does not oxidize, nor does the surface alter, which would not be the case but for the fact that adsorption pads are employed.

If ordinary polishing using wax were done, wax would be adhered to the wafers after they are undone from the plate. If they were then aquatically stored, the purified water would become contaminated by the wax. The wax that is the source of the contamination would mix into and spread throughout the water, and the surface of the wafers would end up being contaminated. Aquatic storage would be problematic in that it would give rise to expansion of the contamination. Therefore, aquatic storage works well when the wafers are clean and unsoiled. The fact that the wafers are unsoiled in having been polished using an adsorption pad allows aquatic storage to manifest prominent effectiveness.

In short, aquatic storage done with wax-employing polishing is meaningless. The significance of aquatic storage begins with non-wax polishing.

From the following detailed description in conjunction with the accompanying drawings, the foregoing and other objects, features, aspects and advantages of the present invention will become readily apparent to those skilled in the art.

BEST MODE FOR CARRYING OUT THE INVENTION

The present invention eliminates finishing polish done (mirror polishing) according to the organic-compound- (wax-) applying plate-paste process. The wafers are retained utilizing adsorption pads instead. Chemical-solvent cleaning becomes unnecessary. Since the wafers are stored in water, surface degradation such as particle adherence, oxidization, and alteration does not occur. Wafers with uncontaminated surfaces are gained. Using FIGS. 1 and 3, a wafer manufacturing method under the present invention will be explained in contrast to a conventional method. Processes that are the same as those of the conventional technique are labeled with the same reference marks.

Figure 3:
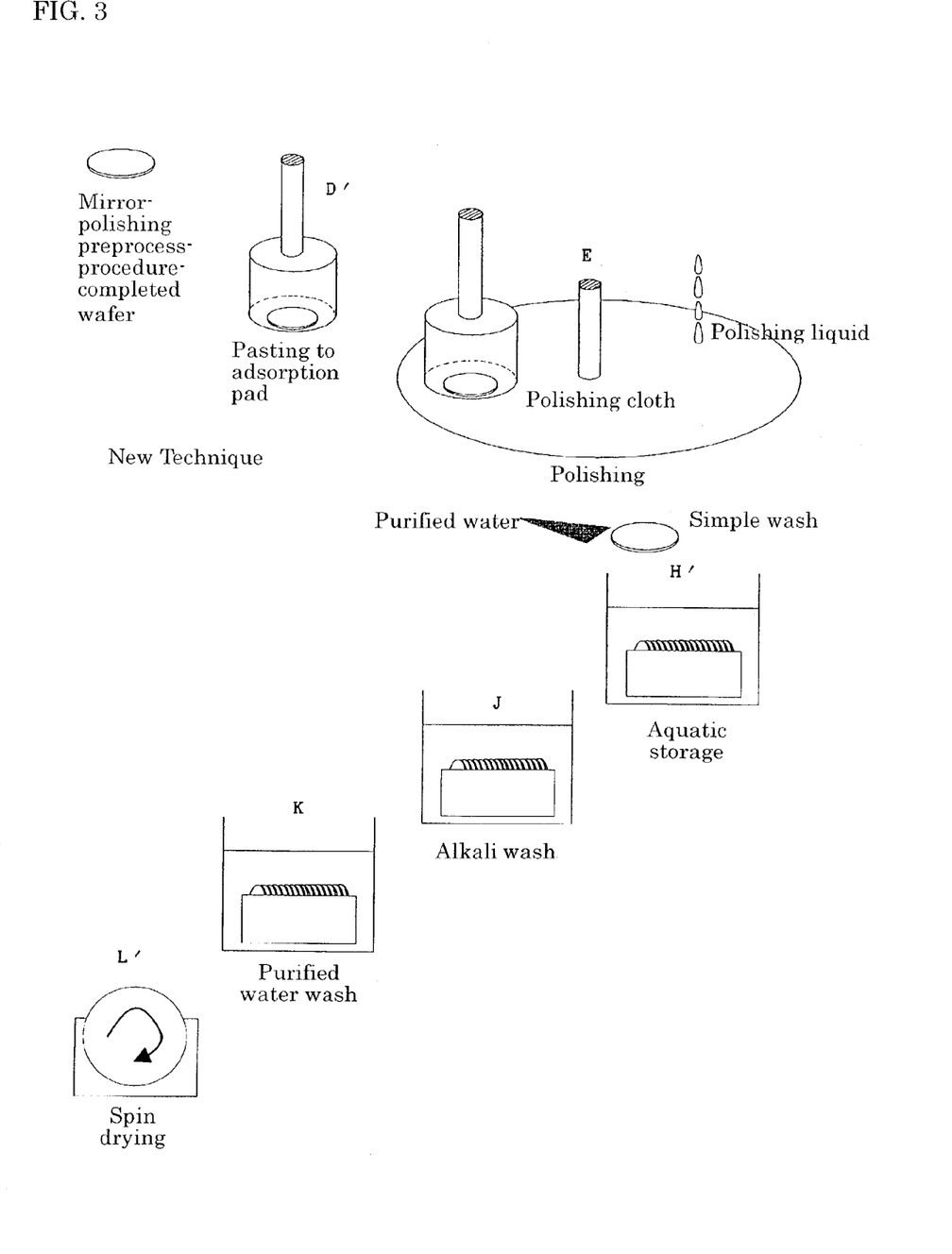
FIG. 3 is a perspective view illustrating the process series in the method under the present invention for manufacturing compound semiconductor wafers.

Present Invention Procedure (FIGS. 1 and 3)

(a) Polishing-Preprocess Procedure (Preparatory Procedure for Polishing)

A. Lapping—flattens either surface of as-cut wafers to a predetermined thickness. Etching to remove slicing procedure distortions is sometimes done prior to that. Herein the etching process at the beginning is omitted. The wafers are then beveled to shave the ridgeline.

B. Etching—removes processing distortions due to lapping.

(b) Polishing Procedure (procedure for polishing wafers using polishing equipment)

(C. Wax Application not Done.)

D'. Tacking to adsorption pad—the reverse surface of a wafer without wax is pressed against, to fix it onto, an adsorption pad glued into a recess in the bottom face of the polishing plate that, depending on the size of the wafer, is 0.2 mm to 0.8 mm larger than the wafer in size. The aforementioned "recess" in the polishing plate may be formed, for example, by gluing a template having a hole 0.2 mm to 0.8 mm larger than the wafer in size onto the adsorption pad. An adsorption pad is adhered into the hole, filling it. The height of the hole is less than the thickness of the wafer. The recess in the polishing plate may also be formed by grinding the bottom face of the plate. The 0.2 mm to 0.8 mm is the play of the wafer in the recess. Leeway on that order is needed on account of the wafers being tacked on. Since the wafer will slip to that extent the recess should not be too wide. This is how the range is selected.

One wafer is tacked onto a single polishing plate in FIG. 3. Depending on its dimensions some polishing plates are single-wafer, and some are multiple-wafer. An adsorption pad made from a flexible material having a flat and smooth surface is glued onto the back surface of the polishing plate, and against it a water-wet wafer or a heated wafer is pressed, adsorbing the wafer onto the pad. Wax is unnecessary. Whether the wafer is heated or immersed in water depends on the properties of the adsorption pad. The wafer surface that is exposed to the exterior is the obverse face. The polishing plate is a jig being a disk atop which a shaft is fixed.

E. Mirror Polishing—the polishing face of the polishing plate is set onto a broad platen onto which a polishing cloth is bonded, and the wafer is pressed against the platen by putting pressure on the shaft. The platen is rotated while a polishing liquid is fed in. Herein, a single polishing plate on a single platen is illustrated, but a plurality of polishing plates can be set onto the polishing cloth and polished simultaneously. The obverse surface is thereby mirror-polished smooth and flat.

(F. Drying not Done.)

G'. Taking off from the polishing plate—since the wafer is attached to the porous adsorption pad simply by the action of water, pouring water over it or cooling it readily lets the wafer be separated from the adsorption pad with a spatula. The wafer obverse surface is mirrorlike, while reverse surface is free of adhered organic matter. Neither surface is contaminated.

H'. Aquatic storage—the wafers are stored in ultra-purified water without being brought out into the air. A plurality of wafers that are put into a cassette as in FIG. 3 is simultaneously stored in water. The most striking improvement through the present invention lies in this.

With the conventional method of drying aerially, dust and debris (referred to as "particles") in the air adhere to the wafers. Though they are dried in a clean-room, there will be debris on the wafers no matter how clean they are said to be. This debris will not fail to stick to the wafers. When debris sticks to the surface of a wetted wafer, after the water droplets have dried, the debris clings firmly and cannot easily be removed.

In addition, the wafer surfaces are oxidized by and alter due to oxygen and minute amounts of chemical substances in the air. Thus with aerial drying and storage is the danger of oxidization and alteration of, and debris adherence to, the wafers. In this respect, storing in ultra-purified water eliminates the risk of oxidization and alteration. This is because there is neither oxygen nor chemical substances in ultra-purified water. What is more, there is no adhering of particles. As a storage method aquatic storage is flawless. It is a perfect method in eliminating oxidization and alteration of, and debris adherence to, the wafers as just mentioned, and the present invention in presenting this is very unconventional and epochal. Furthermore, by submerging the post-polished wafers meanwhile the polishing liquid is sufficiently gotten rid of while cleaning, contamination may be decreased still further.

The question then might arise as to why aquatic storage could not have been managed until now. This would likely owe to inconvenience in conveyance and transport. After the polishing procedure, because the wafers must be transferred to the cleaning procedural stage, therein the wafers must in any event be inserted into a cassette and carried, and under the present circumstances, wafer transport unless atmospheric has not been possible. Nonetheless, with aquatic storage transporting the cassettes through water is possible by means of conveyers that work under water, arms that operate in water, and the fore end of submerged arms. The present invention transports the wafers through water to pass them to the cleaning procedural stage that follows. Although aquatic transport machinery must be newly created, since it may be employed perennially once manufactured, raised cost is temporary.

The foregoing processes D'., E., G'. and H'. are the polishing procedure, wherein in contrast to the conventional example, the wax application process C. does not exist. Therefore, the wafers do not become soiled with wax, and the labor of taking the wax off is made unnecessary. The aerial drying process F. is also eliminated. With atmospheric drying are problems of debris adherence, oxidization, and alteration that with the present invention are not present at all. What is hereby yielded is uncontaminated wafers whose obverse surfaces are mirror-polished and to whose reverse surfaces organic matter is not adhered.

(c) Cleaning Procedure (Using Alkali and Purified Water to Wash Away Particles Adhered to the Wafer Reverse and Obverse Surfaces)

(I. Organic Solvent Wash not Done.)

J. Alkali wash—obverse-surface oxidization film and contaminants (particles) are taken away using caustic soda or the like.

K. Purified water wash—alkali and contaminants (particles) are taken away using purified water.

L'. Spin drying—the wafers are attached onto a spinner, and rapidly dried by spinning the spinner at high speed so as to send the water droplets flying off under centrifugal force. Since the water droplets fly off under centrifugal force, oxidization and alteration do not encroach, and there is no risk of light particles clinging to the wafers. Though this is in a sense atmospheric drying, because it is rapid drying, the possibility of oxidization, alteration and debris accumulation may be eliminated. Since organic matter does not stick to the wafers as in the prior art, organic solvent vapor drying is not needed.

Processes J.—L'. are the cleaning procedure, wherein in contrast with the prior art, there is no organic solvent wash I. This is one of the advantages of the present invention. Inasmuch as no wax is applied, taking wax off with an organic solvent unnecessary. Reduction in the amount of organic solvent used is beneficial for environmental preservation and for improvement of the working environment. This procedure may be carried out integratively with a plurality of wafers inserted into a cassette. By this procedure the wafers become mirror-polished wafers having uncontaminated obverse surfaces.

(d) Inspection/Measuring Procedure (Inspection/Measuring According to Specifications from the Shipping Destination)

M. Obverse surface inspection/gauging—microscopic observation of the wafer obverse surface and gauging of particle density are performed. For example, the number of particles whose diameter is a set value or more is counted. Mirror wafers that meet the specifications of the shipping destination (device manufacturer) will thereby be produced. Wafers passing these tests undergo a final cleaning and are shipped out. This procedure is the same as the prior art.

(e) Final Cleaning Procedure (Final Manufacturer-End Cleaning of Wafers that have Passed Inspection)

N. Alkali wash—organic matter and other contaminants adhering to the obverse surface are taken away using alkali.

O. Purified water wash—alkali and contaminants are taken away using purified water.

P'. Spin drying—the wafers are adsorbed onto a spinner and rapidly dried by spinning at high speed to send the water droplets flying off.

This procedure is the same as the prior art. In this way mirror wafers are fabricated, and in that state are shipped to the device maker. By the wafer maker's effort up to this point, the wafer obverse surface will be far cleaner than what has been conventional. The wafers may be used as they are at the device maker's as substrates for thin-film growing. The wafers do not have to be etched and cleaned on the device manufacturer end prior to thin-film growing, which allows such burdensome prior processes to be omitted. This produces tremendous benefits for the device maker.

EXAMPLE

Four-inch GaAs wafers and six-inch GaAs wafers were fabricated according to the method under the present invention. GaAs ingots were sliced into rounds, etched and lapped. These were adsorbed onto an adsorption pad on a polishing plate and pressed against a rotary platen; by spinning the platen while flowing a polishing liquid on them the wafers were polished.

After polishing the wafers were undone from the adsorption pad. With a simple cleaning and without drying they were aquatically stored within ultra-purified water. Thereafter they were alkali washed, purified-water washed, and spin-dried. Then, based on specifications from the shipping destination, they were inspected and measured. Thereafter they were given an alkali wash, a purified-water wash, and a spin dry.

This yielded mirror wafers. The mirror wafers were examined under a microscope. It was confirmed that the obverse surfaces were completely cleared of residual organic matter, and that they were uncontaminated mirror wafers free of alterations in and oxidized films on the mirror-like face, and of adhered particles.

Next, in order to evaluate advantages on the device-maker end, without carrying out a thin-film growth preprocess procedure on the uncontaminated mirror wafers, a thin film was grown directly onto the wafers (substrates). Foreign matter present between the wafers and the thin film was assayed, which confirmed that there was no residual foreign matter in between the substrate (wafer) obverse surface and the thin film.

For comparison's sake GaAs wafers were fabricated by the conventional fabrication procedures (FIG. 1 left side; FIG. 2). A thin film was grown directly onto the substrates without likewise carrying out the thin-film growth preprocess procedure (etching, cleaning) on wafers according to the conventional technique. Foreign matter between the obverse surface and the thin film was assayed, whereupon the presence of residual foreign matter was confirmed.

The present invention carries out wafer polishing by means of a polishing plate that does not use wax, and aquatically stores without drying the post-polished wafers undone from the polishing plate. Inasmuch as the drying process is omitted, there is no obverse surface oxidation, obverse surface alteration, nor debris adherence. Inasmuch as no wax is used, there is no residual organic matter. The present invention enables, markedly more so than conventionally, the fabrication of high-quality, uncontaminated mirror wafers. This thereby enables omitting on the device-maker end (the shipping destination) preprocessing, such as etching and cleaning, for thin-film formation. A further advantage is that abnormal growth appearing when thin films are grown on top of conventional-technique wafers does not occur.

Figure 4:
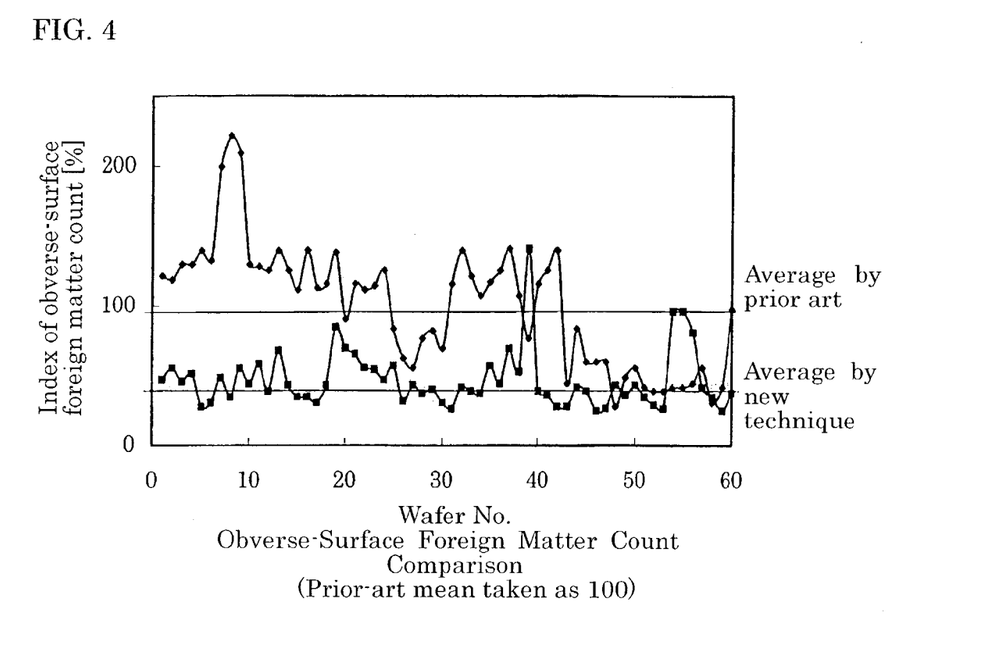
FIG. 4 is a graph plotting results of measuring surface foreign-matter counts on 60 GaAs wafers respectively manufactured according to the conventional method for manufacturing compound semiconductor wafers, and to the method under the present invention for manufacturing compound semiconductor wafers. The horizontal scale is the wafer sample number; the vertical scale is the relative percent of surface-present foreign matter (particles), wherein the average in the conventional technology instance is taken as 100%. This relative value is not particle density, but individual particle count over the entire wafer.
Figure 5:
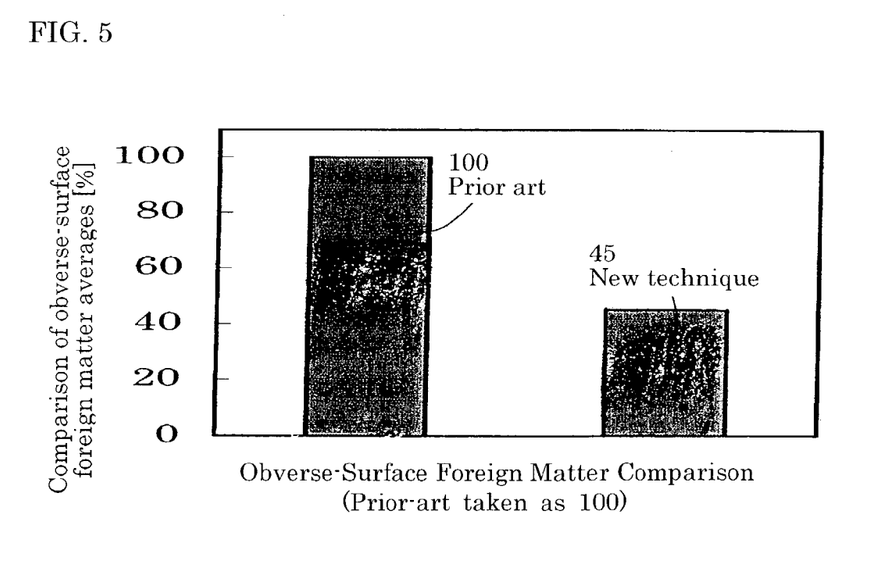
FIG. 5 is a graph representing averages for the relative values of surface-particle counts (conventional technique taken as 100%) for 60 GaAs wafers fabricated by the conventional technique, and 60 GaAs wafers fabricated by the present invention. As against the particle count on wafers according to the conventional technique, the particle-count average with the present invention is reduced by approximately half.

Comparison of Obverse-Surface Foreign-Matter Counts (FIGS. 4 and 5)

Obverse-surface foreign-matter counts (particles/wafer) on 60 GaAs wafers (after final cleaning procedure (e)) fabricated by the present invention method (■) and 60 GaAs wafers fabricated by the. conventional technique (♦) were assayed. The wafer-by-wafer assay results are plotted as a line graph (frequency polygon) in FIG. 4. The horizontal scale is numbers 1 through 60 assigned to the wafers. The horizontal scale is nominal, being the sample numbers that therefore while in the frequency polygon, do not correlate in the horizontal direction. The vertical scale is relative scores for obverse-surface foreign-matter counts on wafers from the conventional technique (expressed in percentages; 100% being the prior-art level), wherein the average of the obverse-surface foreign-matter counts is taken to be 100. A horizontal line has been drawn at the average level for obverse-surface foreign-matter counts on wafers from the conventional technique. Likewise, a horizontal line is also drawn at the average of the obverse-surface foreign-matter counts on wafers by the present invention.

The foreign-matter counts (particles) on the wafers from the conventional technique are larger. Likewise, fluctuation in the foreign-matter count is greater. The particle score for No. 8 was 222%; for No. 9, 206%; and for No. 7, 203%. For Nos. 42 and 37 there was 140% obverse-surface foreign matter. Oppositely, the particle score was about 41% for wafers No. 49 and 53.

The foreign-matter counts (particles) on the wafers from the present invention are slight, and foreign-matter count fluctuations are small. Nos. 5, 31, 42, 43, 46 and 58 are the slightest at 27%. As expressed by 140% for No. 39 and 96% for No. 54, foreign-matter counts that are large will be found, even though the items are from the present invention. Nevertheless, overall the foreign-matter counts are slight, and the fluctuations are small. As shown in FIG. 5, the average obverse-surface foreign-matter count (particle score) for wafers from the present invention was 45%, meaning that it decreased to around 45% of the conventional technique by comparison. A decrease like this in obverse-surface foreign-matter count attests as described to the superiority of the present invention.

Figure 6:
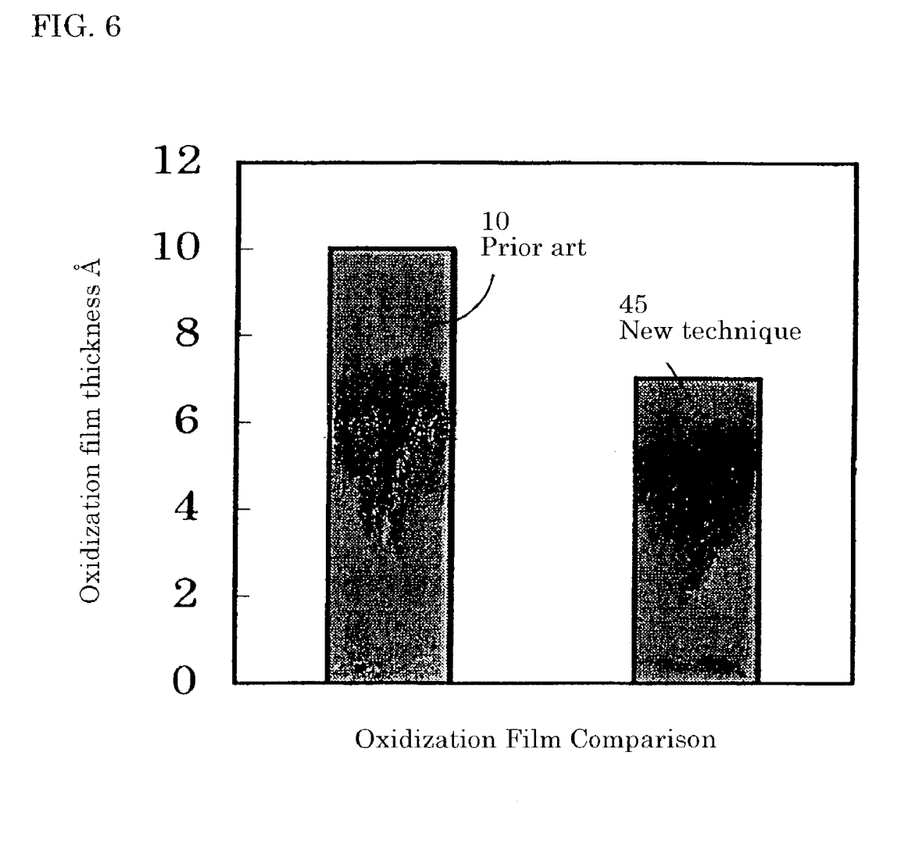
FIG. 6 is a graph representing averages of the thickness of surface oxidization films on 60 GaAs wafers fabricated by the conventional technique, and 60 GaAs wafers fabricated by the present invention. The oxidization-film thickness average for wafers by the conventional technique is 1.0 nm, while oxidization-film thickness average for wafers by the present invention is 0.7 nm. The average oxidization-film thickness is reduced by 0.3 nm.

Comparison of Obverse-Surface Oxidization Film Thickness (FIG. 6)

The thicknesses of obverse-surface oxidization films in the same 60 wafers-apiece sample groups were gauged. As shown in FIG. 6, the obverse-surface oxidization film thickness average for wafers by the conventional technique was 1.0 nm. The oxidization-film average thickness for wafers by the present invention was 0.7 nm, meaning that the oxidization film became about 0.3 nm thinner. This is an effect of aquatic storage. Inasmuch as the wafers were brought out into the air and dried following aquatic storage, the obverse surface did oxidize slightly, as would be expected.

Figure 7:
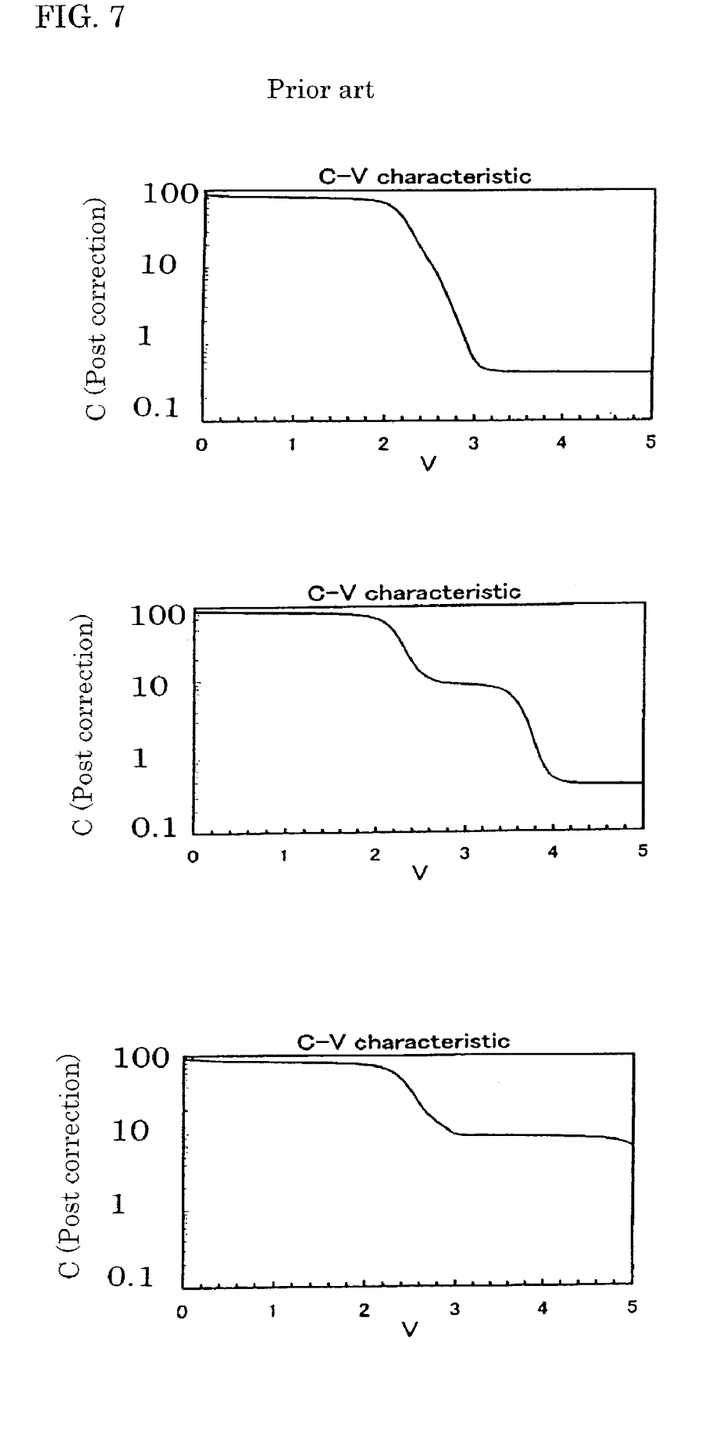
FIG. 7 is graphs plotting results of preparing a P-N junction and measuring C-V characteristics in three locations, in a single wafer fabricated by the conventional technique. The horizontal axis is the applied voltage; the vertical axis is the capacitance (the dependent value). That the C-V characteristics are inconsistent among the three is evident.
Figure 8:
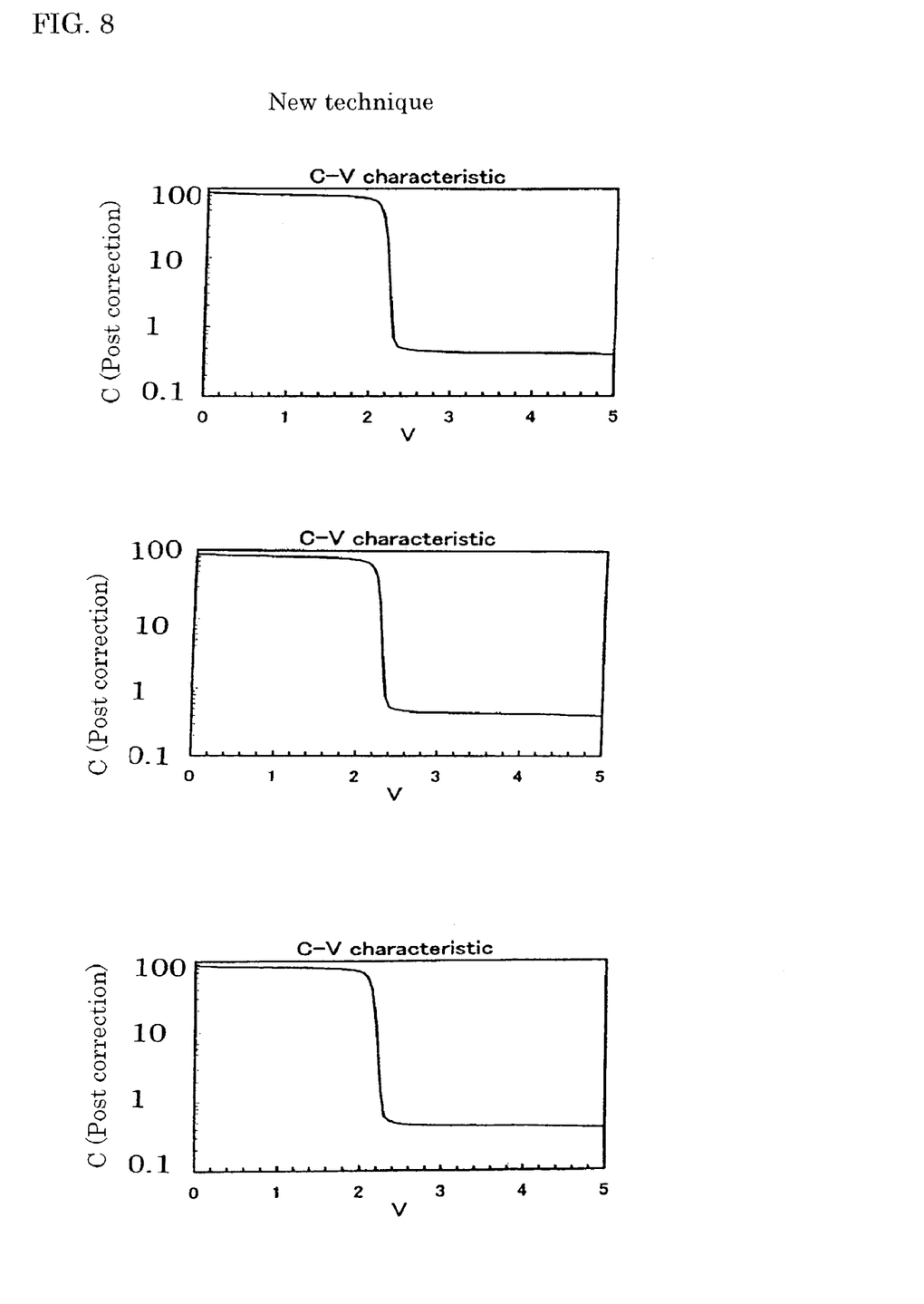
FIG. 8 is graphs plotting results of preparing a P-N junction and measuring C-V characteristics in three locations, in a single wafer fabricated by the technique of the present invention. The horizontal axis is the applied voltage; the vertical axis is the capacitance (the dependent value). That the C-V characteristics are uniform among the three is evident.

Comparison of C-V Characteristics (FIGS. 7 and 8)

By doping a P-type impurity onto N-type GaAs wafers P-N junctions were produced, and three points forming central angles of 120 degrees in a single wafer were chosen and a reverse bias was applied to the P-N junction at the three points to gauge the capacitance. The C-V characteristics for a GaAs wafer from the conventional technique are plotted in FIG. 7, while the C-V characteristics for a GaAs wafer from the present invention are plotted in FIG. 8. The horizontal scale indicates the reverse bias (V), and the vertical scale indicates the capacitance (the dependent value).

In the conventional case (FIG. 7), at each of the three points the P-N junction variation differs respectively. The voltage at which C drops is not uniform, and in one instance drops in two stages. The drop is also abnormally small. The C-V characteristics vary inconsistently depending on location, even though within in a single wafer. This signifies that due to the presence of foreign matter on the obverse surface, P-N junction thickness is inconsistent.

In the present invention case (FIG. 8), at any of the three points the P-N junction exhibits an abrupt drop in C at 2.2 V. Although the three points for testing are isolated locations, the C-V characteristics bear a strong resemblance. This means that there is no inconsistency in the quality, which is a superior advantage.

INDUSTRIAL APPLICABILITY (1) With the present invention wafers are adsorbed to an adsorption pad without using wax and polished. The wafers do not get soiled with wax. With the conventional technique, the wafers are cleaned in an organic solvent in order to take off wax smudges, but even then organic matter would remain. The case with the present invention is that wax and like organic material is from the start not used in the least, and therefore the wafers do not get soiled by organic matter. Inasmuch as none sticks to the wafers, organic matter need not be removed.

(2) Organic solvent washing is rendered unnecessary, because from the start there is no soiling due to organic matter. Organic solvents are noxious and the waste liquid contaminates the environment. Since the amount of organic solvent used maybe reduced, the present invention is efficacious in terms of environmental protection.

(3) Since the post-polished wafers are not dried and are aquatically stored within purified water, particles do not adhere to the obverse surface, which lets the surfaces be retained uncontaminated.

(4) Since the post-polished wafers are not dried and are aquatically stored within purified water, obverse-surface oxidization and alteration do not occur, which lets the surfaces be maintained unimpaired.

(5) The fact that obverse-surface particles are few and that there is no obverse-surface oxidization means that there is no need for etching, alkali washing, and purified-water washing a second time on the device-maker end.

(6) The fact that obverse-surface particles are few and that obverse-surface oxidization does not occur means that the characteristics of devices produced on the surface of the wafers will have few inconsistencies and will be of high quality.

The invention claimed is:

1. A compound-semiconductor-wafer manufacturing method comprising:
    a wafer-tacking step of adsorbently fixing, without using organic material, a compound semiconductor wafer onto an adsorption pad bonded onto a polishing plate;
    a polishing step of pressing the wafer against a polishing platen and polishing the wafer;
    a removal step of taking the wafer off the polishing plate;
    a storage step of aquatically storing the wafer within purified water without drying the wafer; and
    a film deposition step of growing thin film onto the wafer stored in said storage step, without cleaning the wafer.

2. The compound-semiconductor-wafer manufacturing method set forth in claim 1, further comprising a cleaning procedure, free of organic solvent washing, for cleaning the aquatically stored wafer.

3. The compound-semiconductor-wafer manufacturing method set forth in claim 2, further comprising a step of dripping water onto a smooth surface that the adsorption pad has and pressing the wafer onto the adsorption pad, to hold the wafer fast to the adsorption pad by means of water surface tension.

4. The compound-sernlconductor-wafer manufacturing method set forth in claim 2, wherein in said wafer-tacking step, a template having a hole 0.2 mm to 0.8 mm diametrlcilly larger than the wafer diameter is mounted onto the adsorption pad, and the wafer is fixed to the adsorption pad surface within the template hole.

5. The compound-semiconductor-wafer manufacturing method set forth in claim 1, further comprising a step of dripping water onto a smooth surface that the adsorption pad has and pressing the wafer onto the adsorption pad, to hold the wafer fast to the adsorption pad by means of water surface tension.

6. The compound-semiconductor-wafer manufacturing method set forth in claim 5, wherein in said wafer-tacking step, a template having a hole 0.2 mm to 0.8 mm diametrically larger than the wafer diameter is mounted onto the adsorption pad, and the water is fixed to the adsorption pad surface within the template hole.

7. The compound-semiconductor-wafer manufacturing method set forth in claim 1, wherein in said wafer-tacking step, a template having a hole 0.2 mm to 0.8 mm diametrically larger than the wafer diameter is mounted onto the adsorption pad, and the wafer is fixed to the adsorption pad surface within the template hole.

8. The compound-semiconductor-wafer manufacturing method set forth in claim 1, further comprising:
    a post-storage washing step of washing the aquatically stored wafers in purtfied water; and
    a post-storage drying step, following said post-storage washing step, of spin-drying the wafers.

9. The compound-semiconductor-wafer manufacturing method set forth in claim 1, wherein in said wafer-tacking step, a template having a hole 0.2 mm to 0.8 mm diametrically larger than the wafer diameter is mounted onto the adsorption pad, and the wafer is fixed to the adsorption pad surface within the template hole.

* * * * *